(12) United States Patent
Schumaker

(10) Patent No.: US 7,854,867 B2
(45) Date of Patent: Dec. 21, 2010

(54) METHOD FOR DETECTING A PARTICLE IN A NANOIMPRINT LITHOGRAPHY SYSTEM

(75) Inventor: Philip D. Schumaker, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 502 days.

(21) Appl. No.: 11/737,301

(22) Filed: Apr. 19, 2007

(65) Prior Publication Data

US 2007/0246850 A1 Oct. 25, 2007

Related U.S. Application Data

(60) Provisional application No. 60/793,857, filed on Apr. 21, 2006.

(51) Int. Cl.
*B29C 59/02* (2006.01)
(52) U.S. Cl. .................................................. 264/40.1
(58) Field of Classification Search ................ 264/40.5, 264/319, 40.1, 443
See application file for complete search history.

(56) References Cited

U.S. PATENT DOCUMENTS

| | | |
|---|---|---|
| 4,512,848 A | 4/1985 | Deckman et al. |
| 4,731,155 A | 3/1988 | Napoli et al. |
| 4,848,911 A | 7/1989 | Uchida et al. |
| 4,959,252 A | 9/1990 | Bonnebat et al. |
| 5,028,366 A | 7/1991 | Harakal et al. |
| 5,094,533 A | 3/1992 | Sawada et al. |
| 5,110,514 A | 5/1992 | Soane |
| 5,148,037 A | 9/1992 | Suda et al. |
| 5,151,754 A | 9/1992 | Ishibashi et al. |
| 5,179,863 A | 1/1993 | Uchida et al. |
| 5,240,550 A | 8/1993 | Boehnke et al. |
| 5,259,926 A | 11/1993 | Kuwabara et al. |
| 5,362,940 A | 11/1994 | MacDonald et al. |
| 5,371,822 A | 12/1994 | Horwitz et al. |
| 5,392,123 A | 2/1995 | Marcus et al. |
| 5,425,848 A | 6/1995 | Haisma et al. |
| 5,480,047 A | 1/1996 | Tanigawa et al. |
| 5,512,131 A | 4/1996 | Kumar et al. |
| 5,545,367 A | 8/1996 | Bae et al. |
| 5,601,641 A | 2/1997 | Stephens |
| 5,669,303 A | 9/1997 | Maracas et al. |
| 5,772,905 A | 6/1998 | Chou |
| 5,776,748 A | 7/1998 | Singhvi et al. |
| 5,812,629 A | 9/1998 | Clauser |

(Continued)

FOREIGN PATENT DOCUMENTS

JP 55-88332 7/1980

(Continued)

OTHER PUBLICATIONS

Kalman Filter, Apr. 16, 2004, Wikipedia (attained using internet archive) PDF attached.*

(Continued)

*Primary Examiner*—Kat Wyrozebski
*Assistant Examiner*—Robert J Grun
(74) *Attorney, Agent, or Firm*—Laura C. Robinson

(57) ABSTRACT

A method for detecting a particle between a nanoimprint mold assembly and a substrate in a nanoimprint lithography system.

11 Claims, 9 Drawing Sheets

U.S. PATENT DOCUMENTS

| | | |
|---|---|---|
| 5,820,769 A | 10/1998 | Chou |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,948,470 A | 9/1999 | Harrison et al. |
| 5,956,216 A | 9/1999 | Chou |
| 5,963,315 A | 10/1999 | Hiatt et al. |
| 5,974,150 A | 10/1999 | Kaish et al. |
| 6,046,056 A | 4/2000 | Parce et al. |
| 6,074,827 A | 6/2000 | Nelson et al. |
| 6,218,316 B1 | 4/2001 | Marsh |
| 6,274,294 B1 | 8/2001 | Hines |
| 6,309,580 B1 | 10/2001 | Chou |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,411,010 B1 | 6/2002 | Suzuki et al. |
| 6,449,035 B1 | 9/2002 | Batchelder |
| 6,482,742 B1 | 11/2002 | Chou |
| 6,498,640 B1 | 12/2002 | Ziger |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,621,960 B2 | 9/2003 | Wang et al. |
| 6,646,662 B1 | 11/2003 | Nebashi et al. |
| 6,678,038 B2 | 1/2004 | Binnard |
| 6,696,220 B2 | 2/2004 | Bailey et al. |
| 6,713,238 B1 | 3/2004 | Chou et al. |
| 6,776,094 B1 | 8/2004 | Whitesides et al. |
| 6,809,356 B2 | 10/2004 | Chou |
| 6,825,437 B2 | 11/2004 | Nakano et al. |
| 6,828,244 B2 | 12/2004 | Chou |
| 6,849,558 B2 | 2/2005 | Schaper |
| 6,871,558 B2 | 3/2005 | Choi et al. |
| 6,873,087 B1 | 3/2005 | Choi et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,921,615 B2 | 7/2005 | Sreenivasan et al. |
| 6,932,934 B2 | 8/2005 | Choi et al. |
| 6,946,360 B2 | 9/2005 | Chou |
| 6,955,767 B2 | 10/2005 | Chen |
| 6,955,868 B2 | 10/2005 | Choi et al. |
| 6,964,793 B2 | 11/2005 | Willson et al. |
| 7,036,389 B2 | 5/2006 | Choi et al. |
| 7,060,402 B2 | 6/2006 | Choi et al. |
| 7,077,992 B2 | 7/2006 | Sreenivasan et al. |
| 7,117,583 B2 | 10/2006 | Dinan et al. |
| 7,128,875 B2 | 10/2006 | Cubicciotti |
| 2002/0042027 A1 | 4/2002 | Chou et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0137494 A1 | 7/2003 | Tulbert |
| 2003/0174435 A1 | 9/2003 | Dinan et al. |
| 2003/0186140 A1 | 10/2003 | Fries |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0223883 A1* | 11/2004 | Choi et al. ............... 422/82.05 |
| 2004/0250945 A1 | 12/2004 | Zheng et al. |
| 2005/0037143 A1 | 2/2005 | Chou et al. |
| 2005/0260295 A1 | 11/2005 | Choi et al. |
| 2005/0264132 A1 | 12/2005 | Choi et al. |
| 2006/0019183 A1 | 1/2006 | Voisin |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2006/0203234 A1 | 9/2006 | Gilton |
| 2007/0228593 A1 | 10/2007 | Jones et al. |
| 2007/0243279 A1 | 10/2007 | McMackin et al. |
| 2008/0028360 A1 | 1/2008 | Picciotto et al. |

FOREIGN PATENT DOCUMENTS

| | | |
|---|---|---|
| JP | 57-7931 | 1/1982 |
| JP | 63-138730 | 6/1988 |
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Mittal, Precision Motion Control of a Magnetic Suspension Actuator Using a Robust Nonlinear Compensation Scheme, IEE/ASME Transactions on Mechatronics. vol. 2. No. 4, pp. 268-280 Dec. 1, 1997.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Uchida et al., A Mask-to-Wafer Alignment and Gap Setting Method for X-ray Lithography Using Gratings, J. Vac. Sci. Technol. B 9 (6), pp. 3202-3206 Nov. 1, 1991.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 57-7931, Apr. 14, 2004.

Abstract of Japanese Patent 63-138730, Apr. 14, 2004.
Abstract of Japanese Patent 55-88332, Apr. 14, 2004.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol b. 19(6) Nov. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Colburn et al., Dissertation for the Degree of Doctor of Philosophy, Step and Flash Imprint Lithography: A Low-Pressure, Room-Temperature Nanoimprint Lithography Aug. 1, 2001.

Shao et al., Near-Field Enhanced, Mold-Assisted, Parallel Direct Nanostructuring of a Gold Thin Film on Glass, Applied Physics Letters, vol. 85(22), pp. 5346-5349 Nov. 29, 2004.
Li et al., Nanopatterning of a Silicon Surface by Near-Field Enhanced Laser Irradiation, Nanotechnology, vol. 14(5), pp. 505-508 Jan. 1, 2003.
Liu et al., Focusing Surface Plasmons with a Plasmonic Lens, Nano Lett, 5(9), pp. 1726-1729 Jul. 29, 2005.
Nozoe et al., Recent Technology for Particle Detection on Patterned Wafers, Proceedings of 1995 IEEE International Reliability Physics Symposium Apr. 6, 1995.
Kuwabara et al., Detection of Particles on Quarter mu m Thick or Thinner SOI Wafers, Jpn. J. Appl. Phys. 1, Regul. Pap. Short Notes Rev. Pap. Apr. 1, 1999.
Hattori, Measurement of Particles on Wafer Surfaces, Ultraclean Surface Processing of Silicon Wafers. Secrets of VLSI manufacturing Jan. 1, 1998.
Nozoe et al., Advanced Surface Inspection Techniques for SOI Wafers, Proc. SPIE—Int. Soc. Opt. Eng. Jan. 1, 1998.
Hattori et al., Challenges of Finer Particle Detection on Bulk-Silicon and SOI Wafers, Diffus. Defect Data B, Solid State Phenom. Jan. 1, 2005.
Abstract of Japanese patent 02-192045, Jul. 27, 1990.
PCT/US07/09589 International Search Report, Nov. 24, 2008.
Kicking Wiki Out of the Patent Office, L. Woellert. Business Week Sep. 4, 2006 Issue 3999, p. 12 [Retrieved from Internet on Nov. 13, 2009 at http://www.businessweek.com/magazine/content/06_36/c3999012.htm#ZZZ6MALU8RE].

* cited by examiner

US 7,854,867 B2

METHOD FOR DETECTING A PARTICLE IN A NANOIMPRINT LITHOGRAPHY SYSTEM

CROSS-REFERENCE TO RELATED APPLICATIONS

The present application claims priority to U.S. Provisional Application No. 60/793,857, filed on Apr. 21, 2006, entitled "In-Situ Particle Detection Methods for Imprint Lithography Tools," which is incorporated herein by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
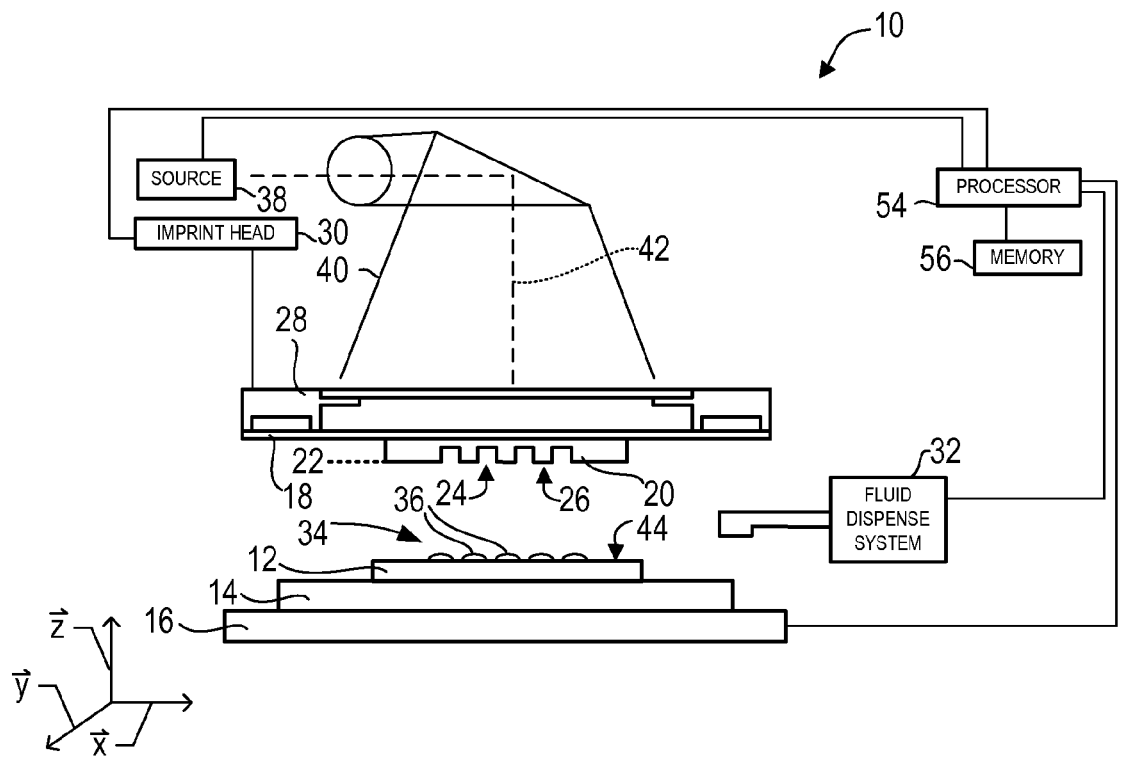
FIG. 1 is a simplified side view of a lithographic system having a mold spaced-apart from a substrate.

Referring to FIG. 1, a system 10 to form a relief pattern on a substrate 12 is shown. In an example, substrate 12 may be a double sided polished 200 mm silicon wafer having thickness variations less than 500 nm. Substrate 12 may be coupled to a substrate chuck 14, described further below. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having a mesa 20 extending therefrom towards substrate 12 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Template 18 may be coupled to a template chuck 28, template chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes" which is incorporated herein by reference. Further, template chuck 28 may be coupled to an imprint head 30 to facilitate movement of template 18, and therefore, mold 20.

System 10 further comprises a fluid dispense system 32. Fluid dispense system 32 may be in fluid communication with substrate 12 so as to deposit polymeric material 34 thereon.

System 10 may comprise any number of fluid dispensers, and fluid dispense system 32 may comprise a plurality of dispensing units therein. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. Typically, polymeric material 34 is disposed upon substrate 12 before the desired volume is defined between mold 20 and substrate 12. However, polymeric material 34 may fill the volume after the desired volume has been obtained.

Figure 2:
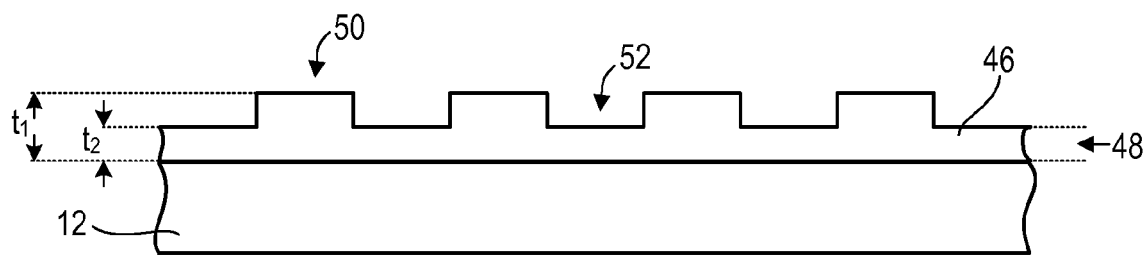
FIG. 2 is a top down view of the substrate shown in FIG. 1, having a patterned layer thereon.

Referring to FIGS. 1 and 2, system 10 further comprises a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween that is filled by polymeric material 34. In an example, imprint head 30 may apply a force of less than 10 Newtons to template 18 such that mold 20 contacts polymeric material 34. After the desired volume is filled with polymeric material 34, source 38 produces energy 40, e.g., broadband ultraviolet radiation that causes polymeric material 34 to solidify and/or cross-link conforming to the shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$, with thickness $t_1$ being greater than thickness $t_2$. System 10 may be regulated by a processor 54 that is in data communication with stage 16, imprint head 30, fluid dispense system 32, and source 38, operating on a computer readable program stored in memory 56.

Figure 5:
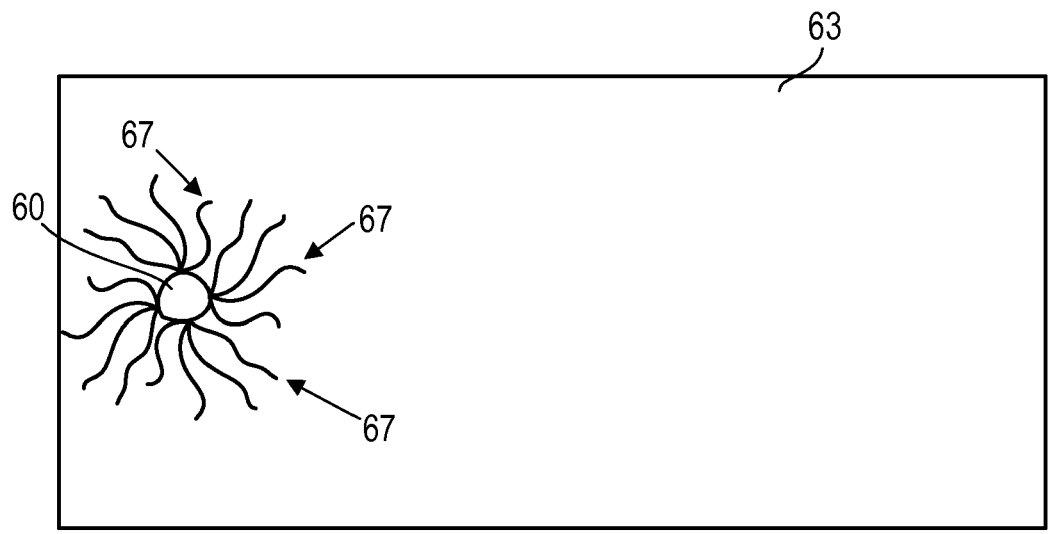
FIG. 5 is a top down view of the conformal layer and the particle, both shown in FIG. 4.

Referring to FIGS. 1-4, during the aforementioned patterning process, a particle 60 may become positioned between substrate 12 and mold 20, which may be undesirable. In a first example, particle 60 may be positioned upon surface 44 of substrate 12; however, in a further example, particle 60 may be positioned within patterned layer 46. In a further embodiment, a plurality of particles 60 may be positioned between substrate 12 and mold 20. Particle 60 may have a thickness $t_3$, with thickness $t_3$ being greater than thickness $t_1$ and thickness $t_2$. In an example, thickness $t_3$ may be in a range of 25 nm to 2 μm. To that end, the presence of particle 60 between substrate 12 and mold 20 frustrates control of the thickness of subsequently disposed layers upon substrate 12. This is shown by formation of multi-layered structure 61 resulting from the deposition of a conformal layer 63 upon patterned layer 46. In the present example, conformal layer 63 may be formed employing spin-on techniques as discussed in U.S. Pat. No. 7,122,079, entitled "Composition for an Etching Mask Comprising a Silicon-Containing Material," which is incorporated herein by reference. The presence of particle 60 reduces the planarity of a surface 65 of conformal layer 63. The presence of particle 60 may result in deleterious artifacts, inter alia, thickness variations in conformal layer 63. These deleterious artifacts may be present as protrusions in surface 65 and may be referred to as comets 67, shown in FIG. 5. As a result, surface 65 is provided with a roughness that frustrates patterning of features thereon. Similar roughness problems in subsequently formed surfaces arise in the presence of artifacts generated by particle 60. To that end, a method of detecting a presence of particle 60 between substrate 12 and mold 20 is described further below.

The combined height variations of substrate 12 and substrate chuck 14 typically have low spatial frequencies and low amplitudes. Height variations on double side polished 200 mm silicon wafers are much less than 500 nm. Imprint head 38 (shown in FIG. 1) in an imprinter typically has a very fine resolution and an accuracy that is equal to or better than the absolute height variations present in substrate 12 and substrate chuck 14. The imprint process brings template 18 into liquid contact with a very small applied force. This force is usually less than 10 N. In the event that a particle is between template 18 and substrate 12 during the imprint, the low-force nature of the imprint process leaves template 18 resting on the particle. The resulting imprint position, as measure by imprint head 38, is then smaller than what would be expected because template 18 has not moved down as far as was expected. The delta between the actual imprint position and the expected position can be used as a discriminator to determine whether a particle is present.

If only large particle detection is required (e.g., greater than 10 microns), then a simple comparison between the actual and expected values can be sufficient. However, if sensitivity to smaller particles is required, then an adaptive algorithm provides better results. There are several sources of noise in the system such as encoder accuracy, thermal drift, wafer height and wafer chuck height variations. These noise sources typically vary slowly with time or slowly with location of substrate 12. An adaptive filter, such as a Kalman filter, can be tuned for rapid convergence to a desired sensitivity level while also tracking low frequency changes to a mean value. The ability to track these changes results in a detection system that is capable of sensing smaller particles. As the tool imprints, position signals of imprint head 38 are used to update the filter which gradually converges to a tighter error bound. Simultaneously, the predicted value adapts to the low frequency curvature on substrate chuck 14.

Figure 3:
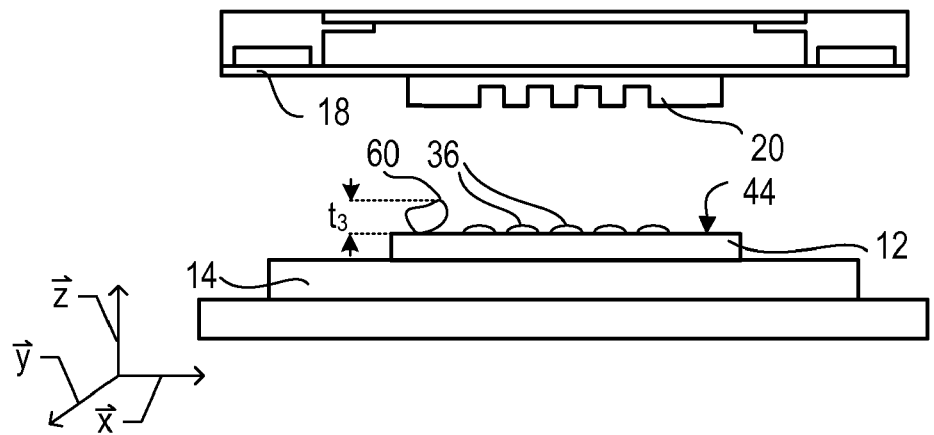
FIG. 3 is a side view of the lithographic system shown in FIG. 1, with a particle positioned between the mold and the substrate.
Figure 4:
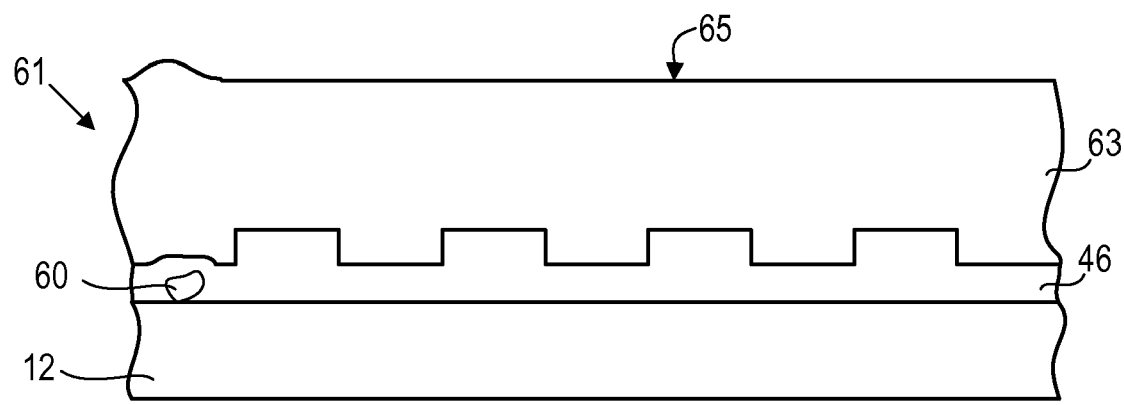
FIG. 4 is a side view of the substrate and patterned layer both shown in FIG. 2, the patterned layer having a conformal layer positioned thereon with a particle.
Figure 6:
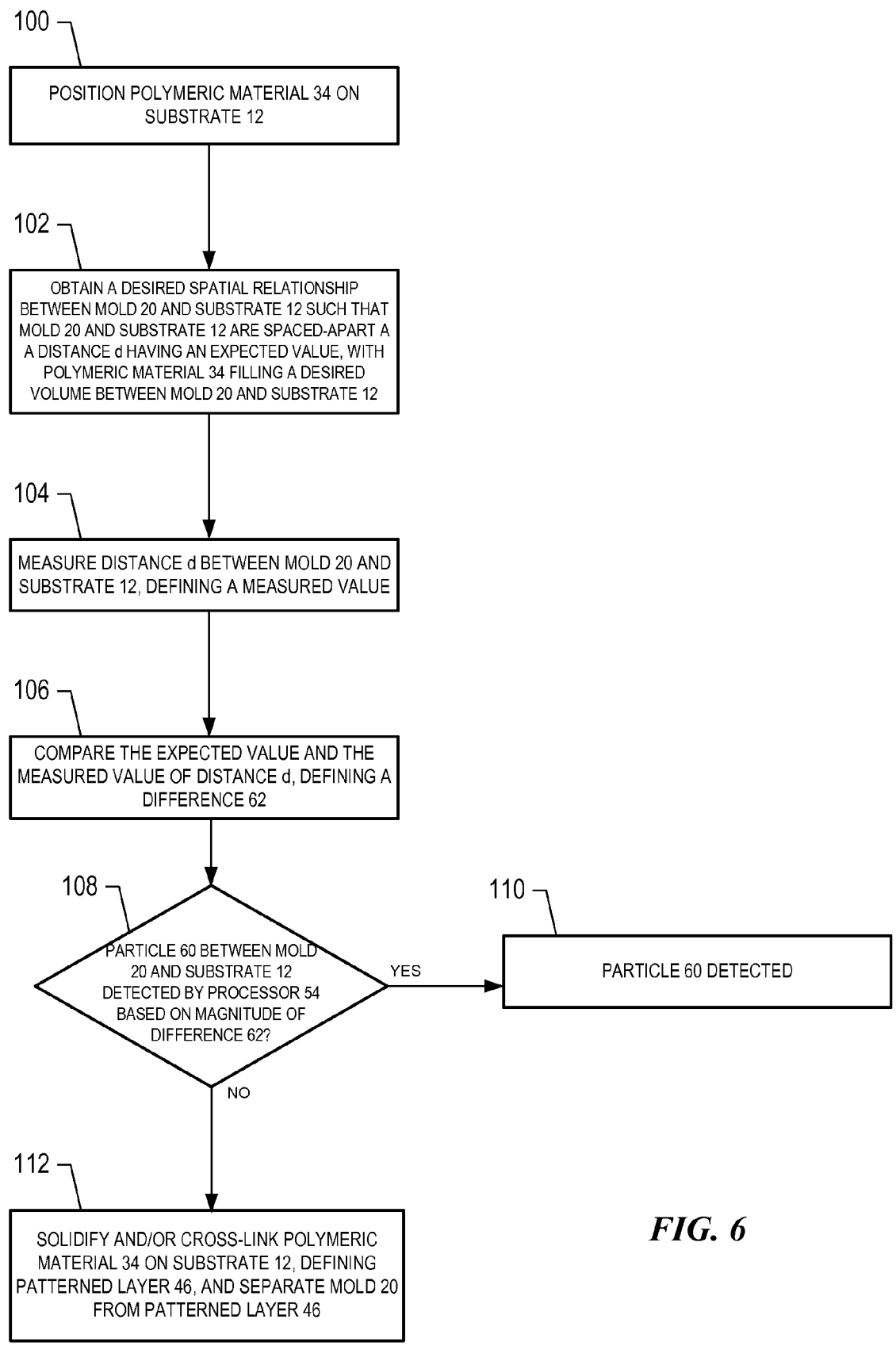
FIG. 6 is a flow chart of a method of detecting a particle in a nanoimprint lithography system, in a first embodiment.

Referring to FIGS. 3 and 6, a method of detecting particle 60 between substrate 12 and mold 20 is shown. This process is applied after fluid has spread but prior to UV exposure. More specifically, at step 100, as mentioned above, polymeric material 34 may be positioned on substrate 12. In a further embodiment, polymeric material 34 may be positioned on mold 20. At step 102, a desired spatial relationship may be obtained between mold 20 and substrate 12 such that polymeric material 34 may fill the desired volume between mold 20 and substrate 12. More specifically, imprint head 30 and stage 16 may arrange mold 20 and substrate 12, respectively, such that mold 20 and substrate 12 are spaced-apart a distance d, with the distance having an expected value stored in memory 56.

Figure 7:
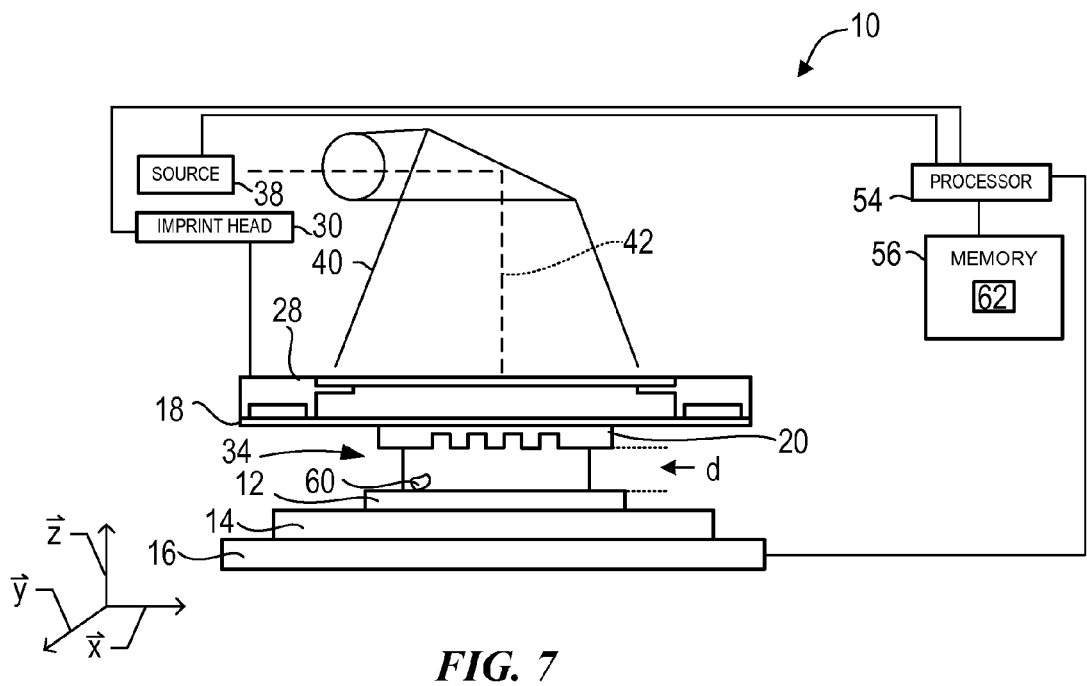
FIG. 7 is a side view of the lithographic system shown in FIG. 1, the substrate and the mold being spaced-apart a distance.

Referring to FIGS. 6 and 7, at step 104, the distance d defined between mold 20 and substrate 12 may be measured, defining a measured value of the distance d. The distance d may be measured employing encoder signals produced by imprint head 30 and transmitted to processor 54, operating on a computer readable program stored in memory 56.

At step 106, a magnitude of the expected value and the measured value of the distance d may be compared by processor 54, operating on a computer readable program stored in memory 56, defining a difference 62 stored in memory 56. Difference 62 may be determined by processor 54 employing a signal processing algorithm, the algorithm being a 1D filter and either adaptive or non-adaptive. At step 108, based on a magnitude of difference 62, processor 54 may determine if particle 60 is present between substrate 12 and mold 20. To that end, at step 110, particle 60 may be detected. In an example, were particle 60 positioned between substrate 12 and mold 20, the measured value of distance d may be greater than the expected value of distance d. However, if there is not a particle 60 detected, at step 112, polymeric material 34 positioned on substrate 12 may be solidified and/or cross-linked, defining patterned layer 46, and mold 20 may be separated from patterned layer 46.

Further, thickness $t_3$ of particle 60 may be less than 50 nm. However, there may be a plurality of sources of noise within system 10 to frustrate detection of particle 60 having a thickness of 50 nm. Such sources of noise include, but are not limited to, encoder signal accuracy, thermal drift of system 10, thickness variations of substrate 12, and thickness variations of substrate chuck 14. To that end, an adaptive filter, such as a Kalman filter may be employed. The Kalman filter may be tuned for rapid convergence to a desired sensitivity level while concurrently tracking low frequency changes to a mean value.

Figure 9:
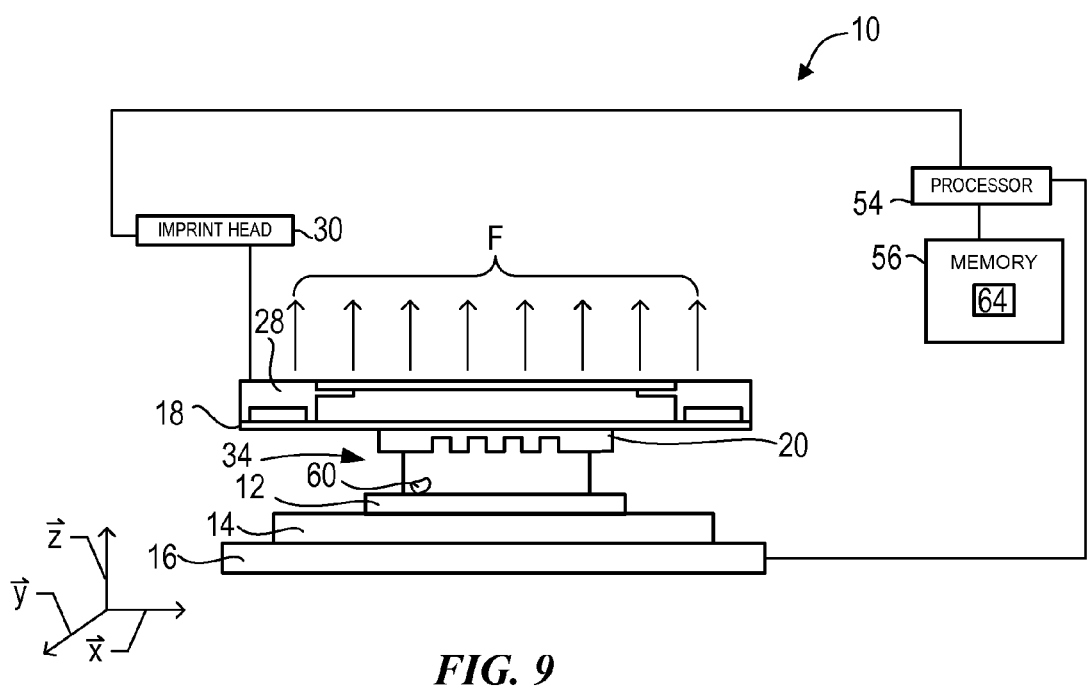
FIG. 9 is a side view of the lithographic system shown in FIG. 1, with a force being applied to the template to separate the mold from the substrate.
Figure 8:
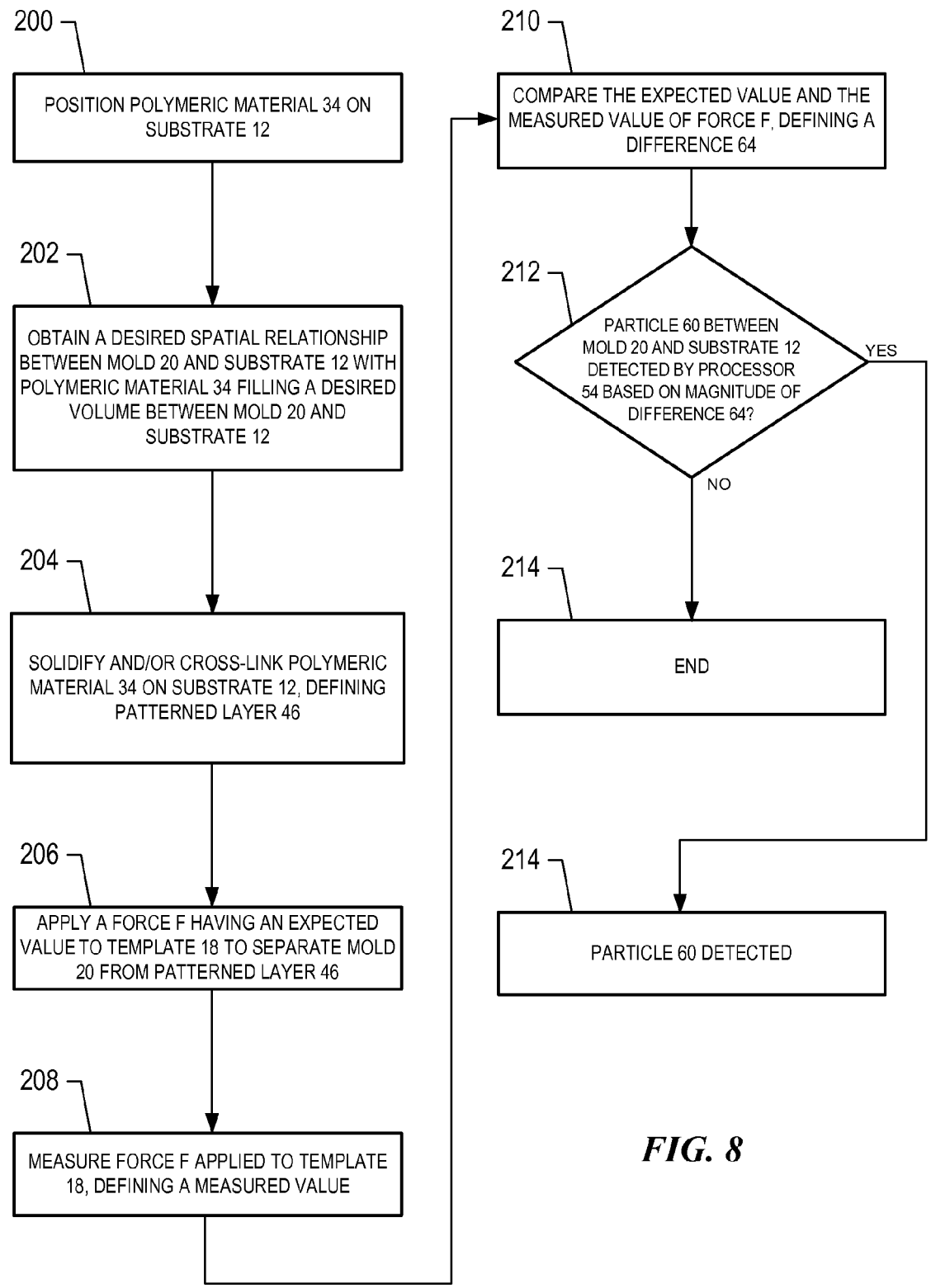
FIG. 8 is a flow chart of a method of detecting a particle in a nanoimprint lithography system, in a second embodiment.

Referring to FIGS. 8 and 9, a further embodiment of detecting particle 60 between substrate 12 and mold 20 is shown. More specifically, at step 200, as mentioned above, polymeric material 34 may be positioned on substrate 12. In a further embodiment, polymeric material 34 may be positioned on mold 20. At step 202, a desired spatial relationship may be obtained between mold 20 and substrate 12 such that polymeric material 34 may fill the desired volume between mold 20 and substrate 12. At step 204, polymeric material 34 positioned on substrate 12 may be solidified and/or cross-linked, defining patterned layer 46.

At step 206, mold 20 may be separated from patterned layer 46 on substrate 12. More specifically, separation of mold 20 from patterned layer 46 is achieved by application of a force F to template 18 by imprint head 30, with the force F having an expected value stored in memory 56. At step 208, the force F applied to template 18 may be measured, with the force having a measured value. The force F may be measured from encoder signals produced by imprint head 30 and transmitted to processor 54, operating on a computer readable program stored in memory 56. Further, the force F may depend upon, inter alia, an area of mold 20.

At step 210, a magnitude of the expected value and the measured value of the force F may be may be compared by processor 54, operating on a computer readable program stored in memory 56, defining a difference 64 stored in memory 56. Difference 64 may be determined by processor 54 employing a thresholding function algorithm, the algorithm being either adaptive or non-adaptive. To that end, at step 212, based on a magnitude of difference 62, processor 54 may determine if particle 60 is present between substrate 12 and mold 20. In an example, were particle 60 positioned between substrate 12 and mold 20, the measured value of force F may be less than the expected value of force F. To that end, at step 214, particle 60 may be detected. However, if there is not a particle 60 detected, at step 216, the aforementioned patterning of substrate 12 has been completed.

Figure 10:
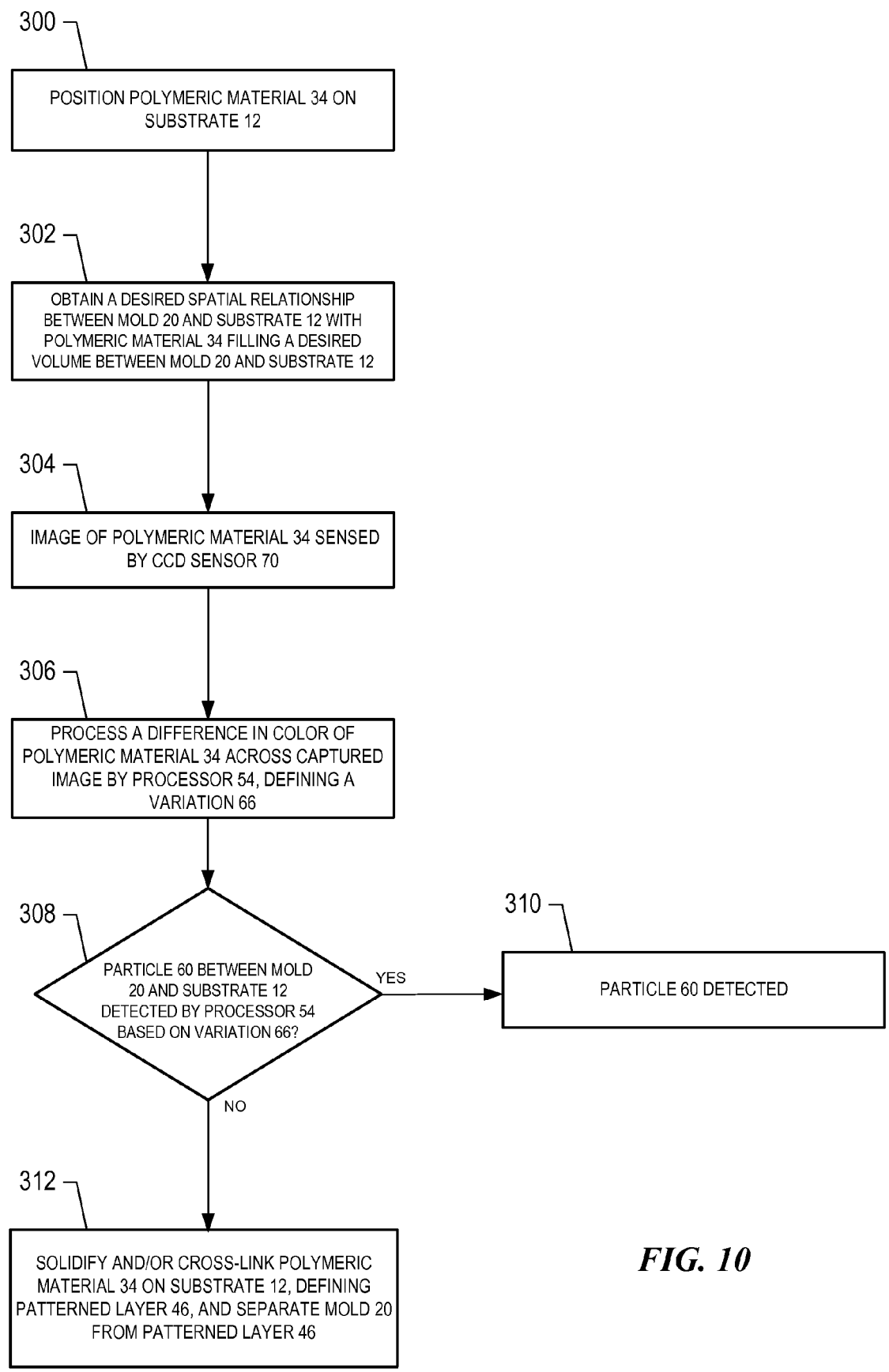
FIG. 10 is a flow chart of a method of detecting a particle in a nanoimprint lithography system, in a third embodiment.
Figure 11:
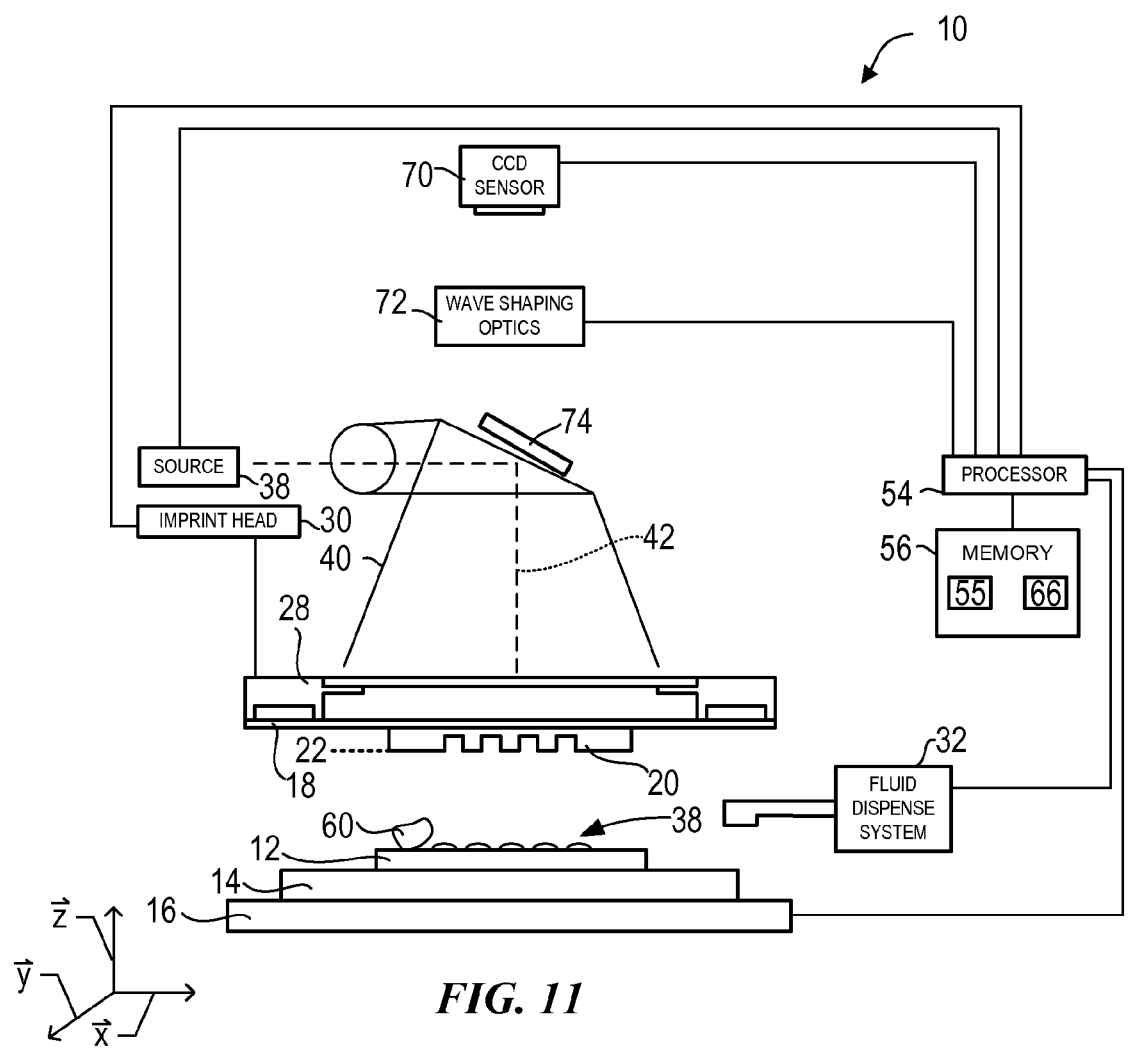
FIG. 11 is a simplified side view of the lithographic system shown in FIG. 1, with the system further comprising a detection system in accordance with a further embodiment of the present invention.

Referring to FIGS. 10 and 11, a third embodiment of detecting particle 60 between substrate 12 and mold 20 is shown, and more specifically, color variations of polymeric material 34 may be employed to detect particle 60. To that end, system 10 may further comprise a detection system that includes a CCD sensor 70 and wave shaping optics 72. The detection system is configured with wave shaping optics 72 positioned between CCD sensor 70 and a mirror 74. CCD sensor 70 and wave shaping optics 72 may be in data communication with processor 54, operating on a computer readable program stored in memory 56, to control an operation thereof.

At step 300, as mentioned above, polymeric material 34 may be positioned on substrate 12. In a further embodiment, polymeric material 34 may be positioned on mold 20. At step 302, a desired spatial relationship may be obtained between mold 20 and substrate 12 such that polymeric material 34 may fill the desired volume between mold 20 and substrate 12.

At step 304, an image of polymeric material 34 may be sensed by CCD sensor 70. At step 306, CCD sensor 70 may produce data corresponding to the image of polymeric material 34. Processor 54 receives the data, and processes differences in color of polymeric material 34, defining a variation 66 stored in memory 56. At step 308, based on variation 66, processor 54 may determine if particle 60 is present between substrate 12 and mold 20. To that end, at step 310, particle 60 may be detected. However, if there is not a particle 60 detected, at step 112, polymeric material 34 positioned on substrate 12 may be solidified and/or cross-linked, defining patterned layer 46, and mold 20 may be separated from patterned layer 46.

In the above mentioned embodiment, a spatial location 55 of variation 64 with respect to substrate 12 may be determined by processor 54, and stored in memory 56. Further, after patterning two or more of substrates 12 in the above-mentioned process, processor 54 may query memory 56 to locate possible particle 60 in spatial location 55. To that end, variations 64 at location 55 may indicate contamination of substrate 12.

Figure 12:
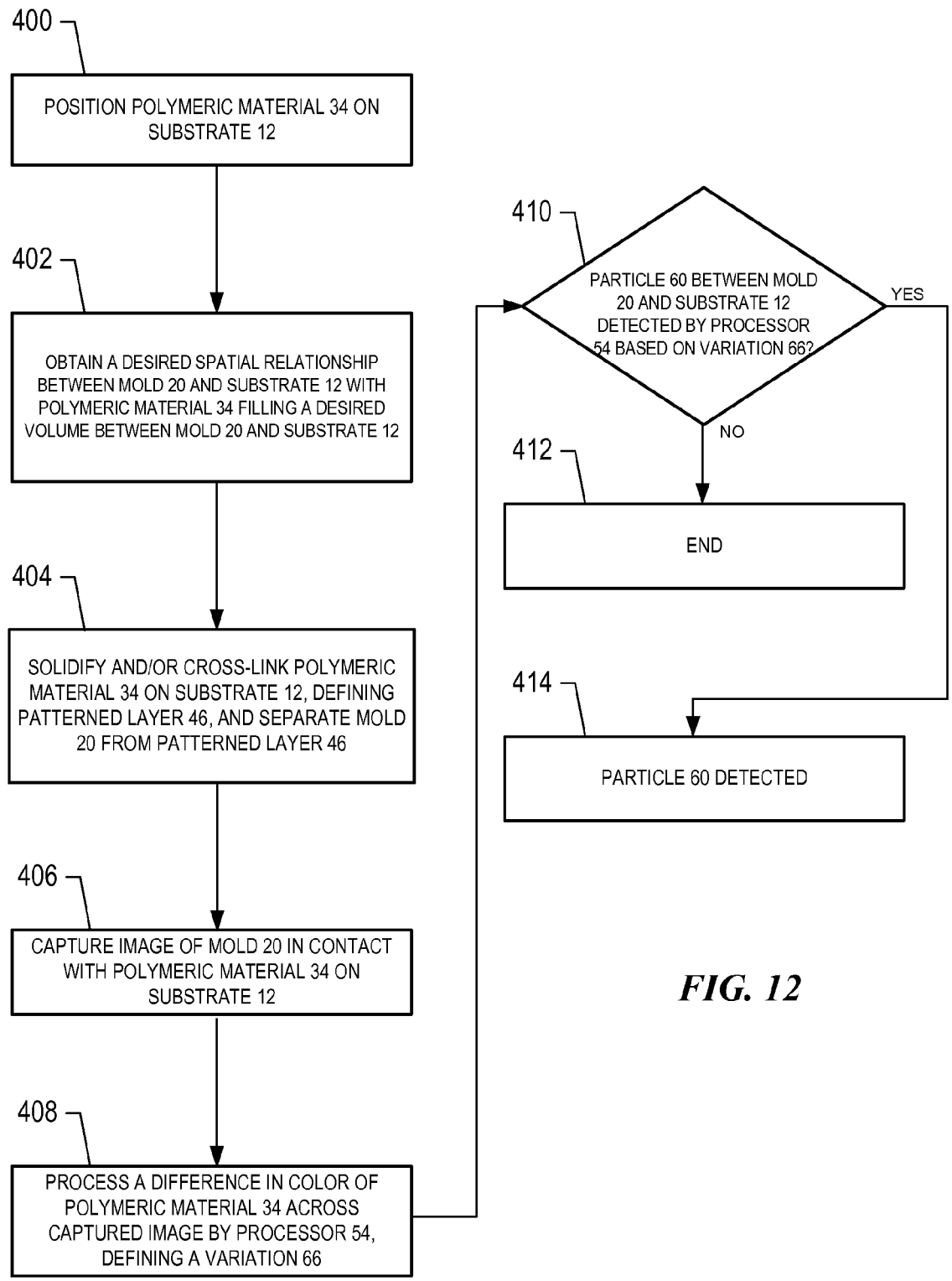
FIG. 12 is a flow chart of a method of detecting a particle in a nanoimprint lithography system, in a fourth embodiment.
Figure 13:
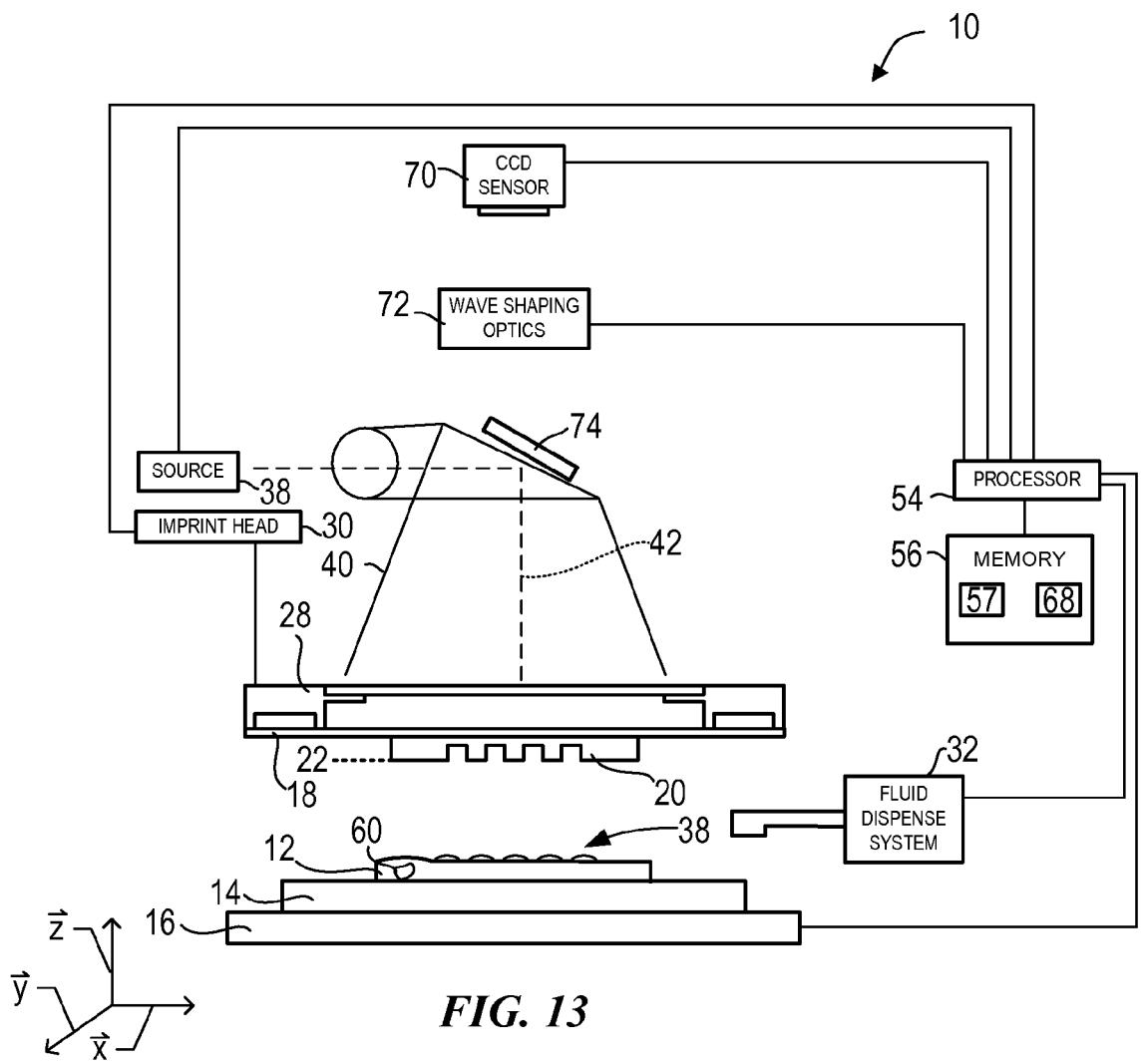
FIG. 13 is a simplified side view of the lithographic system shown in FIG. 1, with the system further comprising a detection system in accordance with a further embodiment of the present invention.

Referring to FIGS. 12 and 13, in fourth embodiment, a method of detecting particle 60 between substrate 12 and substrate chuck 14 is shown. More specifically, at step 400, as mentioned above, polymeric material 34 may be positioned on substrate 12. In a further embodiment, polymeric material 34 may be positioned on mold 20. At step 402, a desired spatial relationship may be obtained between mold 20 and substrate 12 such that polymeric material 34 may fill the desired volume between mold 20 and substrate 12. At step 404, polymeric material 34 positioned on substrate 12 may be solidified and/or cross-linked, defining patterned layer 46.

At step 406, an image of polymeric material 34 may be sensed by CCD sensor 70. At step 408, CCD sensor 70 may produce data corresponding to the image of polymeric material 34. Processor 54 receives the data, and processes a difference in color of polymeric material 34, defining a variation 68 stored in memory 56. At step 410, based on variation 68, processor 54 may determined if particle 60 is present between substrate 12 and mold 20. To that end, at step 412, particle 60 may be detected. However, if there is not a particle 60 detected, at step 414, the aforementioned patterning of substrate 12 has been completed.

In the above mentioned embodiment, a spatial location 57 of variation 68 with respect to substrate 12 may be determined by processor 54, and stored in memory 56. Further, after patterning two or more of substrates 12 in the above-mentioned process, processor 54 may query memory 56 to locate possible particle 60 in spatial locations 57. To that end, variation 68 at location 57 may indicate contamination of substrate chuck 14.

Further, any combination of the above mentioned embodiments may be employed concurrently.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method for detecting a particle between a nanoimprint mold assembly and a substrate in a nanoimprint lithography system, said method comprising:

positioning said nanoimprint mold assembly and said substrate in a desired spatial relationship using an imprint head and a stage, said nanoimprint mold assembly and said substrate being spaced-apart to define a desired distance and desired volume therebetween, said distance having an expected value and said volume substantially filled by polymerizable material;

measuring said distance between said nanoimprint mold assembly and said substrate employing encoder signals produced by said imprint head, defining a measured value of said distance, wherein measuring occurs after fluid has filled the volume between said nanoimprint mold assembly and said substrate;

comparing said measured value of said distance with said expected value of said distance, defining a difference between said measured value and said expected value; and determining a presence of said particle between said nanoimprint mold assembly and said substrate based on said difference.

2. The method as recited in claim 1 wherein said measured value of said distance is greater than said expected value of said distance.

3. The method as recited in claim 1 further including the step of positioning a nanoimprint material between said mold and said substrate.

4. The method as recited in claim 3 further including the step of impinging actinic radiation upon said nanoimprint material.

5. The method as recited in claim 4 wherein comparing occurs prior to impinging said actinic radiation.

6. The method as recited in claim 1 wherein the step of comparing further comprises comparing said measured value of said distance with said expected value of said distance employing an algorithm.

7. The method as recited in claim 1 wherein the step of comparing further comprises comparing said measured value of said distance with said expected value of said distance employing a filter.

8. The method as recited in claim 1 wherein the step of comparing further comprises comparing said measured value of said distance with said expected value of said distance employing an adaptive filter.

9. The method as recited in claim 1 further including the step of filtering noise in said nanoimprint lithography system.

10. The method as recited in claim 9 wherein filtering further comprises applying a Kalman filter.

11. The method as recited in claim 9 wherein filtering further comprises applying an adaptive filter.

* * * * *